(12) United States Patent
Lee et al.

(10) Patent No.: US 10,559,646 B2
(45) Date of Patent: *Feb. 11, 2020

(54) ORGANIC LIGHT EMITTING DIODE DISPLAY HAVING BARRIER LAYER ON AUXILIARY ELECTRODE

(71) Applicant: LG Display Co., Ltd., Seoul (KR)

(72) Inventors: Joonsuk Lee, Paju-si (KR); Sejune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/180,451

(22) Filed: Nov. 5, 2018

(65) Prior Publication Data

US 2019/0140037 A1    May 9, 2019

(30) Foreign Application Priority Data

Nov. 7, 2017 (KR) .................... 10-2017-0147595

(51) Int. Cl.
*H01L 27/32* (2006.01)
*H01L 51/52* (2006.01)
(Continued)

(52) U.S. Cl.
CPC ....... *H01L 27/3276* (2013.01); *G09G 3/3291* (2013.01); *H01L 27/3283* (2013.01); *H01L 27/3295* (2013.01); *H01L 27/3297* (2013.01); *H01L 51/525* (2013.01); *H01L 51/5221* (2013.01); *H01L 51/5225* (2013.01); *H01L 51/5228* (2013.01); *H01L 51/5231* (2013.01); *H01L 51/5234* (2013.01);
(Continued)

(58) Field of Classification Search
CPC ............. H01L 51/5221; H01L 51/5225; H01L 51/5228; H01L 51/5231; H01L 51/5234; H01L 51/5246; H01L 27/322; H01L 27/3246; H01L 27/3253; H01L 27/3276; H01L 27/3283; H01L 27/3288; H01L 27/3295; H01L 27/3297; G09G 3/3291
See application file for complete search history.

(56) References Cited

U.S. PATENT DOCUMENTS

2014/0183502 A1* 7/2014 Song .................. H01L 27/3246
                                                      257/40
2016/0013438 A1* 1/2016 Im ...................... H01L 51/5228
                                                      257/40
(Continued)

*Primary Examiner* — Michael Jung
(74) *Attorney, Agent, or Firm* — Morgan, Lewis & Bockius LLP

(57) ABSTRACT

An organic light emitting diode display is disclosed. The organic light emitting diode display includes a first substrate, a second substrate, and a conductive filler layer between the first substrate and the second substrate. The first substrate includes an auxiliary electrode, a first barrier disposed on the auxiliary electrode, a cathode physically divided by the first barrier and exposing at least a portion of the auxiliary electrode, and a protective layer disposed on the cathode, physically divided by the first barrier, and exposing at least a portion of the auxiliary electrode. The second substrate includes a spacer protruding toward the first substrate and disposed adjacent to the auxiliary electrode and a power line covering at least a portion of the spacer and supplied with a power voltage.

10 Claims, 11 Drawing Sheets

(51) Int. Cl.
   *G09G 3/3291*   (2016.01)
   *H01L 27/12*    (2006.01)
   *G09G 3/3275*   (2016.01)

(52) U.S. Cl.
   CPC ...... *H01L 51/5246* (2013.01); *H01L 51/5253* (2013.01); *G09G 3/3275* (2013.01); *G09G 2310/08* (2013.01); *H01L 27/124* (2013.01); *H01L 27/1248* (2013.01); *H01L 27/1255* (2013.01); *H01L 27/322* (2013.01); *H01L 27/3246* (2013.01); *H01L 27/3253* (2013.01); *H01L 27/3258* (2013.01); *H01L 2251/5315* (2013.01)

(56)          References Cited

U.S. PATENT DOCUMENTS

2016/0149164 A1*   5/2016   Lee ................... H01L 51/5281
                                                           257/40
2018/0006106 A1*   1/2018   Oh ..................... H01L 27/322
2018/0374909 A1*   12/2018  Nishikiori ........... H01L 27/3223

\* cited by examiner

ORGANIC LIGHT EMITTING DIODE DISPLAY HAVING BARRIER LAYER ON AUXILIARY ELECTRODE

This application claims the priority benefit of Korean Patent Application No. 10-2017-0147595 filed on Nov. 7, 2017, which is incorporated herein by reference for all purposes as if fully set forth herein.

BACKGROUND

Technical Field

The present disclosure relates to an organic light emitting diode display.

Discussion of the Related Art

Various display devices have replaced heavier and larger cathode ray tubes (CRTs). Examples of the display devices may include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) converting electric energy into light energy. The OLED includes an anode, a cathode, and an organic emission layer between the anode and the cathode. The OLED display is configured such that the OLED emits light while excitons formed by combining holes from the anode and electrons from the cathode inside an emission layer fall from an excited state to a ground state, and thus displays an image.

However, a large-area OLED display cannot maintain a uniform luminance throughout an entire surface of an active area, on which an input image is displayed, and generates a luminance variation (or luminance deviation) depending on a position. More specifically, a cathode constituting an organic light emitting diode is formed to cover most of the active area, and there is a problem that a power voltage applied to the cathode does not have a constant voltage value throughout the entire surface of the active area. For example, as a difference between a voltage value at an entrance of the cathode supplied with the power voltage and a voltage value at a position apart from the entrance increases due to a resistance of the cathode, the luminance variation depending on the position increases.

The problem is more problematic in a top emission type display device. Namely, in the top emission type display device, because it is necessary to secure a transmittance of a cathode positioned at an upper layer of an organic light emitting diode, the cathode is formed of a transparent conductive material such as indium tin oxide (ITO), or an opaque conductive material with a very small thickness. In this instance, because a surface resistance of the cathode increases, a luminance variation depending on a position remarkably increases corresponding to an increase in the surface resistance.

In order to solve such a problem, a method was proposed to prevent a voltage drop depending on a position by forming a low potential power voltage line including a low resistance material and connecting the low potential power voltage line to a cathode. In the proposed method according to a related art, because the low potential power voltage line was formed on a lower substrate including transistors, one pixel has to further include a connection area of the low potential power voltage line and the cathode in addition to a thin film transistor area and a storage capacitor area. Thus, it was difficult to apply the related art to a high-resolution display including small-sized unit pixels.

SUMMARY

Accordingly, embodiments of the present disclosure are directed to an organic light emitting diode display that substantially obviates one or more of the problems due to limitations and disadvantages of the related art.

An aspect of the present disclosure provides an organic light emitting diode display capable of achieving a uniform luminance by reducing a variation in a low potential power voltage depending on a position.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting diode display comprises a first substrate, a second substrate, and a conductive filler layer interposed between the first substrate and the second substrate, the conductive filler layer including a conductive medium, wherein the first substrate includes an auxiliary electrode, a first barrier disposed on the auxiliary electrode, a cathode included in an organic light emitting diode and divided by the first barrier, the cathode exposing at least a portion of the auxiliary electrode, one end of the cathode directly contacting the auxiliary electrode, and a protective layer disposed on the cathode and divided by the first barrier, the protective layer exposing at least a portion of the auxiliary electrode, one end of the protective layer directly contacting the auxiliary electrode, wherein the second substrate includes a spacer protruding toward the first substrate and disposed adjacent to the auxiliary electrode, and a power line covering at least a portion of the spacer and supplied with a power voltage.

The spacer overlaps the auxiliary electrode.

The spacer overlaps the first barrier.

The power line includes an Evss line and an auxiliary Evss line covering at least a portion of the Evss line, electrically connected to the Evss line and having an area larger than the Evss line.

Only one of the Evss line and the auxiliary Evss line covers at least a portion of the spacer.

The spacer is disposed on the Evss line, and the auxiliary Evss line covers at least a portion of the spacer.

Each of the first substrate and the second substrate includes an emission region and a non-emission region outside the emission region. The Evss line is disposed in the non-emission region. The auxiliary Evss line covers the Evss line and is extended up to at least a portion of the emission region.

The auxiliary Evss line is formed of a transparent conductive material.

The organic light emitting diode display further comprises a power electrode disposed on the first substrate and receiving the power voltage from a power generator, and a second barrier disposed on the power electrode. The cathode is divided by the second barrier and exposes at least a portion of the power electrode. The protective layer is divided by the second barrier and exposes at least a portion of the power electrode.

The cathode directly contacts the power electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that may be included to provide a further understanding of the disclosure and are incorporated in and constitute a part of this application, illustrate embodiments of the disclosure and together with the description serve to explain various principles.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure. In describing various embodiments, the same components may be described in a first embodiment, and a description thereof may be omitted in other embodiments.

The terms "first", "second", etc. may be used to describe various components, but the components are not limited by such terms. The terms are used only for the purpose of distinguishing one component from other components.

Figure 1:
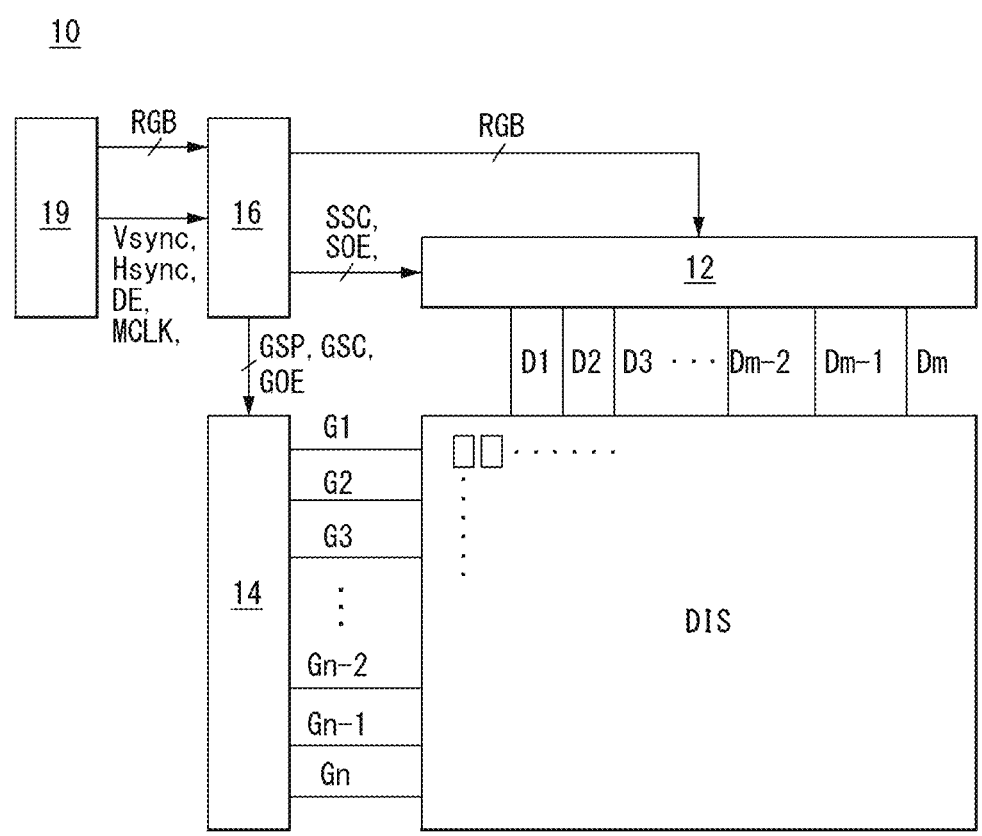
FIG. 1 is a block diagram schematically illustrating an organic light emitting diode (OLED) display according to an embodiment of the disclosure.
Figure 2:
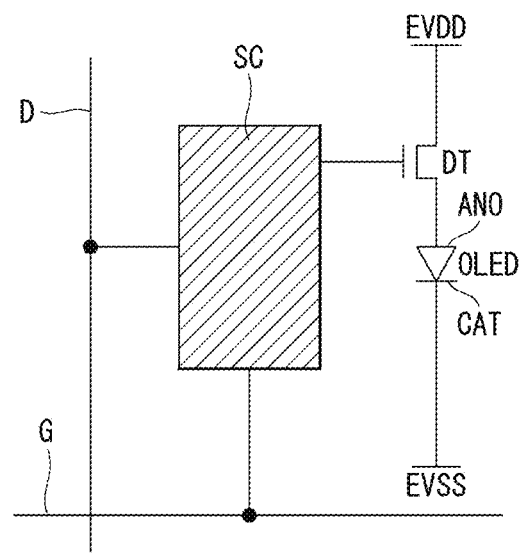
FIG. 2 schematically illustrates configuration of a pixel shown in FIG. 1.

FIG. 1 is a block diagram schematically illustrating an organic light emitting diode (OLED) display according to an embodiment of the disclosure. FIG. 2 schematically illustrates configuration of a pixel shown in FIG. 1.

Referring to FIG. 1, an OLED display 10 according to an embodiment of the disclosure includes a display driving circuit and a display panel DIS.

The display driving circuit includes a data driving circuit 12, a gate driving circuit 14, and a timing controller 16. The display driving circuit applies a video data voltage of an input image to pixels of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 with operation timing of the gate driving circuit 14. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 may be one of a television system, a set-top box, a navigation system, a DVD player, a Blu-ray player, a personal computer (PC), a home theater system, a phone system, and other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS includes a pixel array. The pixel array includes the pixels defined by the data lines D1 to Dm and the gate lines G1 to Gn. Each pixel includes an organic light emitting diode serving as a self-emission element.

Referring to FIG. 2, the display panel DIS includes a plurality of data lines D, a plurality of gate lines G intersecting the data lines D, and pixels respectively arranged at intersections of the data lines D and the gate lines G in a matrix. Each pixel includes an organic light emitting diode, a driving thin film transistor (TFT) DT for controlling an amount of current flowing through the organic light emitting diode, and a programming unit SC for setting a gate-to-source voltage of the driving thin film transistor DT.

The programming unit SC may include at least one switching thin film transistor and at least one storage capacitor. The switching thin film transistor is turned on in response to a gate signal from the gate line G to thereby apply a data voltage from the data line D to one electrode of the storage capacitor. The driving thin film transistor DT controls an amount of current supplied to the organic light emitting diode depending on a magnitude of voltage stored in the storage capacitor, thereby controlling an amount of light emitted by the organic light emitting diode. The amount of light emitted by the organic light emitting diode is proportional to the amount of current supplied from the driving thin film transistor DT. The pixel is connected to a high potential power voltage source and a low potential power voltage source and receives a high potential power voltage EVDD and a low potential power voltage EVSS from a power generator (not shown). The thin film transistors constituting the pixel may be p-type thin film transistors or n-type thin film transistors. Further, semiconductor layers of the thin film transistors constituting the pixel may include amorphous silicon, polycrystalline silicon, or oxide. In the following description, embodiments of the disclosure use a semiconductor layer including oxide as an example. The organic light emitting diode includes an anode ANO, a cathode CAT, and an organic light emitting layer between the anode ANO and the cathode CAT. The anode ANO is connected to the driving thin film transistor DT.

First Embodiment

Figure 3:
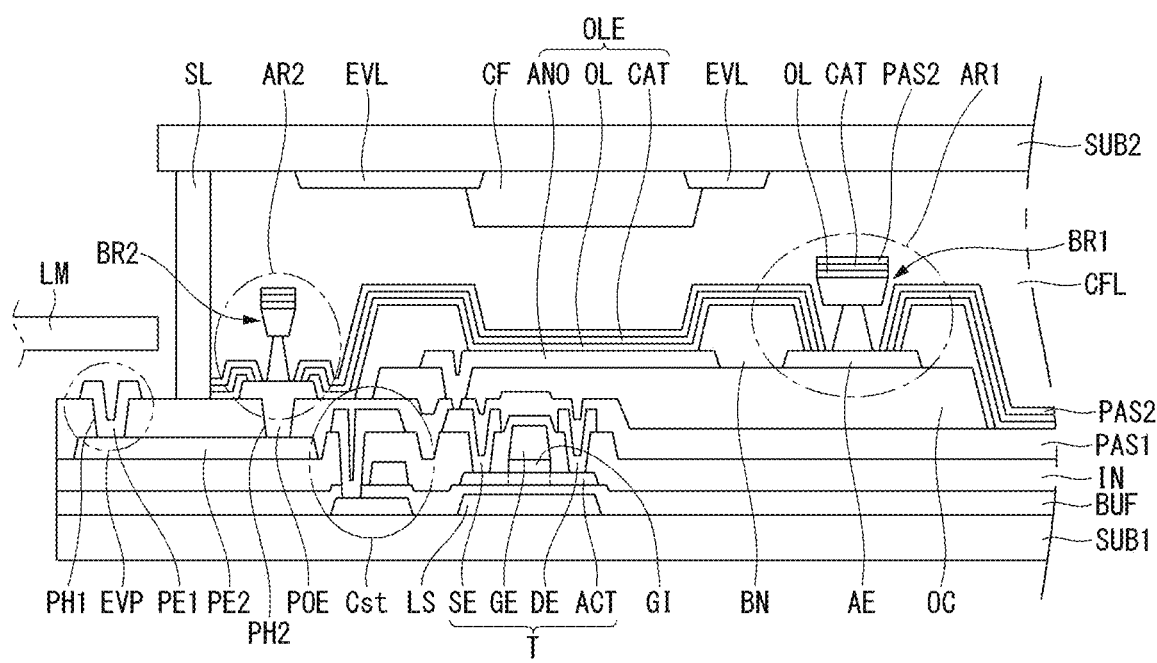
FIG. 3 is a cross-sectional view of an OLED display according to a first embodiment of the disclosure.
Figure 4:
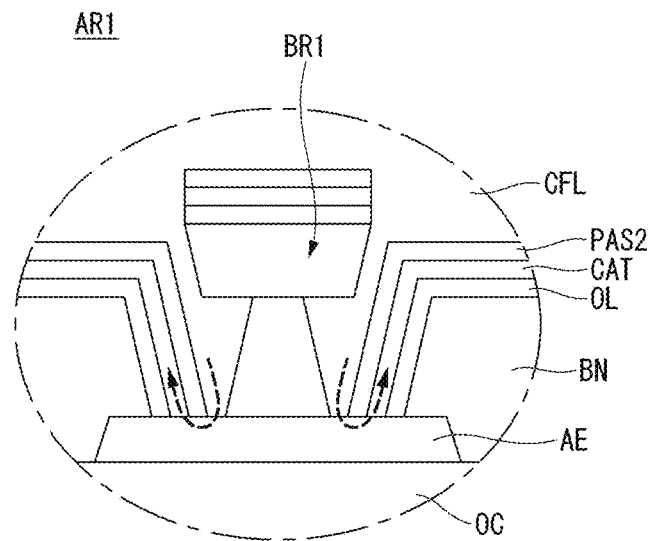
FIG. 4 is an enlarged view of an area AR1 shown in FIG. 3.

FIG. 3 is a cross-sectional view of an OLED display according to a first embodiment of the disclosure. FIG. 4 is an enlarged view of an area AR1 shown in FIG. 3.

Referring to FIG. 3, an OLED display according to a first embodiment of the disclosure includes a display panel including a first substrate SUB1 and a second substrate SUB2 facing each other and a conductive filler layer CFL between the first substrate SUB1 and the second substrate SUB2. The first substrate SUB1 is a thin film transistor array substrate on which a thin film transistor T and an organic light emitting diode OLE are disposed. The second substrate SUB2 is a substrate on which a low potential power voltage line (hereinafter referred to as "Evss line") EVL is disposed. The second substrate SUB2 may function as an encapsulation substrate. The first substrate SUB1 and the second substrate SUB2 may be attached to each other using a sealant SL. The sealant SL is disposed at an edge of the first substrate SUB1 and an edge of the second substrate SUB2 and maintains a predetermined distance between the first substrate SUB1 and the second substrate SUB2. The conductive filler layer CFL may be disposed inside the sealant SL.

The first substrate SUB1 may be made of glass material or plastic material. For example, the first substrate SUB1 may be made of plastic material such as polyimide (PI), polyethylene terephthalate (PET), polyethylene naphthalate (PEN), and polycarbonate (PC) and may have flexible characteristics.

The thin film transistor T and the organic light emitting diode OLE connected to the thin film transistor T are formed on the first substrate SUB1. A light shielding layer LS and a buffer layer BUF may be formed between the first substrate SUB1 and the thin film transistor T. The light shielding layer LS is disposed to overlap a semiconductor layer, particularly, a channel of the thin film transistor T and can protect an oxide semiconductor element from external light. The buffer layer BUF can block ions or impurities diffused from the first substrate SUB1 and also block moisture penetration from the outside.

The thin film transistor T includes a semiconductor layer ACT, a gate electrode GE, a source electrode SE, and a drain electrode DE.

A gate insulating layer GI and the gate electrode GE are disposed on the semiconductor layer ACT. The gate insulating layer GI functions to insulate the gate electrode GE and may be formed of silicon oxide (SiOx). However, embodiments are not limited thereto. The gate electrode GE is disposed to overlap the semiconductor layer ACT with the gate insulating layer GI interposed therebetween. The gate electrode GE may be formed as a single layer or a multilayer using copper (Cu), molybdenum (Mo), aluminum (Al), chrome (Cr), gold (Au), titanium (Ti), nickel (Ni), neodymium (Nd), tantalum (Ta), tungsten (W), or a combination thereof. The gate insulating layer GI and the gate electrode GE may be patterned using the same mask. In this instance, the gate insulating layer GI and the gate electrode GE may have the same area. Although not shown, the gate insulating layer GI may be formed to cover the entire surface of the first substrate SUB1.

An interlayer dielectric layer IN is positioned on the gate electrode GE. The interlayer dielectric layer IN functions to insulate the gate electrode GE and the source and drain electrodes SE and DE from each other. The interlayer dielectric layer IN may be formed of silicon oxide (SiOx), silicon nitride (SiNx), or a multilayer thereof. However, embodiments are not limited thereto.

The source electrode SE and the drain electrode DE are positioned on the interlayer dielectric layer IN. The source electrode SE and the drain electrode DE are spaced from each other by a predetermined distance. The source electrode SE contacts one side of the semiconductor layer ACT through a source contact hole penetrating the interlayer dielectric layer IN. The drain electrode DE contacts the other side of the semiconductor layer ACT through a drain contact hole penetrating the interlayer dielectric layer IN.

Each of the source electrode SE and the drain electrode DE may be formed as a single layer or as a multilayer. When each of the source electrode SE and the drain electrode DE is formed as the single layer, each of the source electrode SE and the drain electrode DE may be formed of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd, Mo/Al, Ti/Al or Cu/MoTi, or as a triple layer of Mo/Al—Nd/Mo, Mo/Al/Mo, Ti/Al/Ti or MoTi/Cu/MoTi.

A passivation layer PAS1 is positioned on the thin film transistor T. The passivation layer PAS1 protects the thin film transistor T and may be formed of silicon oxide (SiOx), silicon nitride (SiNx), or a multilayer thereof.

A planarization layer OC is positioned on the passivation layer PAS1. The planarization layer OC can reduce or planarize a height difference (or step coverage) of an underlying structure and may be formed of an organic material such as photo acryl, polyimide, benzocyclobutene-based resin, and acrylate-based resin. If necessary or desired, one of the passivation layer PAS1 and the planarization layer OC may be omitted.

The organic light emitting diode OLE and an auxiliary electrode AE are positioned on the planarization layer OC. The organic light emitting diode OLE includes an anode ANO, an organic light emitting layer OL, and a cathode CAT.

More specifically, the anode ANO is positioned on the planarization layer OC. The anode ANO is connected to the source electrode SE of the thin film transistor T through a contact hole penetrating the passivation layer PAS1 and the planarization layer OC. The anode ANO may include a reflective layer and thus serve as a reflective electrode. The reflective layer may be formed of aluminum (Al), copper (Cu), silver (Ag), palladium (Pd), nickel (Ni), or a combination thereof. For example, the reflective layer may be formed of Ag/Pd/Cu (APC) alloy. The anode ANO may be formed as a multilayer including a reflective layer.

The auxiliary electrode AE is positioned on the planarization layer OC. The auxiliary electrode AE may be formed of the same material as the anode ANO at the same layer as the anode ANO. In this instance, because a separate process for forming the auxiliary electrode AE does not need to be performed, the number of processes can be reduced. Hence, the manufacturing time and the manufacturing cost can be reduced, and product yield can be remarkably improved. As will be described later, the auxiliary electrode AE may function to receive a low potential power voltage from the Evss line EVL through the conductive filler layer CFL and transfer the low potential power voltage to the cathode CAT.

A bank layer BN is positioned on the first substrate SUB1, on which the anode ANO and the auxiliary electrode AE are formed, and partitions pixels. The bank layer BN may be formed of an organic material such as polyimide, benzocyclobutene-based resin, and acrylate. At least a portion (e.g., center portion) of the anode ANO exposed by a openings of the bank layer BN may be defined as an emission region.

The bank layer BN may be configured to expose the center portion of the anode ANO and cover an edge of the anode ANO. The exposed portion of the anode ANO may be designed to have as large an area as possible, in order to sufficiently secure an aperture ratio. Further, the bank layer BN may be configured to expose a center portion of the auxiliary electrode AE and cover an edge of the auxiliary electrode AE. The exposed portion of the auxiliary electrode AE may be designed to have as large an area as possible, in order to sufficiently secure a contact area between the auxiliary electrode AE and the conductive filler layer CFL.

A first barrier BR1 is positioned on the first substrate SUB1 on which the bank layer BN is formed. The first barrier BR1 is positioned on the auxiliary electrode AE. The first barrier BR1 functions to physically divide each of the organic light emitting layer OL, the cathode CAT, and a protective layer PAS2 that will be formed later. In other words, each of the organic light emitting layer OL, the cathode CAT, and the protective layer PAS2 is disposed on the auxiliary electrode AE and is physically divided by the first barrier BR1. Hence, each of the organic light emitting layer OL, the cathode CAT, and the protective layer PAS2 may be discontinuously formed on the auxiliary electrode AE.

The bank layer BN and the planarization layer OC may be patterned to cover only the thin film transistor T and a storage capacitor Cst connected to the thin film transistor T inside the pixel. As shown in FIG. 3, the storage capacitor Cst may have a triple structure in which first to third capacitor electrodes are stacked. However, embodiments are not limited thereto. For example, the storage capacitor Cst may be implemented as a plurality of layers.

The organic light emitting layer OL is positioned on the first substrate SUB1 on which the first barrier BR1 is formed. The organic light emitting layer OL may be widely formed on a front surface of the first substrate SUB1. The organic light emitting layer OL is a layer, in which electrons and holes combine and emit light. The organic light emitting layer OL includes an emission layer EML and may further include one or more of a hole injection layer HIL, a hole transport layer HTL, an electron transport layer ETL, and an electron injection layer EIL. The emission layer EML may include a light emitting material that generates white light.

The organic light emitting layer OL emitting white light may have a multi-stack structure, for example, an n-stack structure, where n is an integer equal to or greater than 1. For example, 2-stack structure may include a charge generation layer CGL between the anode ANO and the cathode CAT and a first stack and a second stack respectively disposed on and under the charge generation layer CGL. Each of the first stack and the second stack includes an emission layer and may further include at least one common layer. The emission layer of the first stack and the emission layer of the second stack may include emission materials of different colors, respectively.

The organic light emitting layer OL on the auxiliary electrode AE is physically divided by the first barrier BR1. The organic light emitting layer OL is divided by the first barrier BR1 and exposes at least a portion of the auxiliary electrode AE around the first barrier BR1. A portion of the organic light emitting layer OL divided by the first barrier BR1 is positioned on the first barrier BR1.

The cathode CAT is positioned on the organic light emitting layer OL. The cathode CAT may be widely formed on the front surface of the first substrate SUB1. The cathode CAT may be formed of a transparent conductive material such as indium tin oxide (ITO) and indium zinc oxide (IZO). Alternatively, the cathode CAT may be formed of a material, which is thin enough to transmit light, for example, magnesium (Mg), calcium (Ca), aluminum (Al), silver (Ag), or a combination thereof.

The cathode CAT on the auxiliary electrode AE is physically divided by the first barrier BR1. The cathode CAT is divided by the first barrier BR1 and exposes at least a portion of the auxiliary electrode AE around the first barrier BR1. A portion of the cathode CAT divided by the first barrier BR1 is positioned on the first barrier BR1. As will be described later, the cathode CAT may directly contact the auxiliary electrode AE and may be supplied with the low potential power voltage through the auxiliary electrode AE.

The cathode CAT covers the organic light emitting layer OL, and one end of the cathode CAT directly contacts the auxiliary electrode AE. Namely, one end of the cathode CAT, which is divided by the first barrier BR1 and is exposed, directly contacts an exposed upper surface of the auxiliary electrode AE. Such a structure may be implemented by a step coverage difference between materials forming the organic light emitting layer OL and the cathode CAT. For example, because the cathode CAT is made of a transparent conductive material having better step coverage than a formation material of the organic light emitting layer OL, the cathode CAT may be configured to directly contact the auxiliary electrode AE. Furthermore, in order to implement the structure, the organic light emitting layer OL and the cathode CAT may be formed using different methods. For example, the organic light emitting layer OL may be formed using a thermal deposition method, and the cathode CAT may be formed using a sputtering method. Hence, one end of the divided cathode CAT may be extended further than one end of the divided organic light emitting layer OL and may directly contact the auxiliary electrode AE.

The protective layer PAS2 is positioned on the cathode CAT. The protective layer PAS2 may be widely formed on the front surface of the first substrate SUB1. The protective layer PAS2 may be formed of a material such as silicon oxide (SiOx) and silicon nitride (SiNx).

More specifically, the protective layer PAS2 is positioned on the cathode CAT and can block the penetration of foreign material that may enter the organic light emitting diode OLE. For example, because the cathode CAT including a transparent conductive material is a crystalline component and cannot block the penetration of ions and moisture, ionic components or external impurities of an ionic liquid included in the conductive filler layer CFL may pass through the cathode CAT and may enter the organic light emitting layer OL. The first embodiment of the disclosure further includes the protective layer PAS2 on the organic light emitting diode OLE and can block the penetration of foreign material that may enter the organic light emitting diode OLE. Hence, the first embodiment of the disclosure can prevent a reduction in lifespan of the organic light emitting diode OLE and a luminance reduction.

In addition, the protective layer PAS2 is positioned on the cathode CAT and can buffer or mitigate a stress applied to the cathode CAT when the first substrate SUB1 and the second substrate SUB2 are attached to each other. For example, because the cathode CAT including the transparent conductive material has brittle characteristics, the cathode CAT may easily crack due to an external force applied. The first embodiment of the disclosure further includes the protective layer PAS2 on the cathode CAT and can prevent a crack from being generated in the cathode CAT. Furthermore, the first embodiment of the disclosure can prevent the penetration of oxygen or moisture due to the crack.

The protective layer PAS2 on the auxiliary electrode AE is physically divided by the first barrier BR1. The protective layer PAS2 is divided by the first barrier BR1 and exposes at least a portion of the auxiliary electrode AE around the first barrier BR1. A portion of the protective layer PAS2 divided by the first barrier BR1 is positioned on the first barrier BR1. Hence, the portion of the organic light emitting layer OL, the portion of the cathode CAT, and the portion of the protective layer PAS2, each of which is divided by the first barrier BR1, are sequentially stacked on the first barrier BR1.

The Evss line EVL and a color filter CF are formed on the second substrate SUB2. A stacking order of the Evss line EVL and the color filter CF on the second substrate SUB2 may be changed. For example, the color filter CF may be formed after the Evss line EVL is formed, or the Evss line EVL may be formed after the color filter CF is formed.

The Evss line EVL includes a low resistance conductive material. For example, the Evss line EVL may be formed of molybdenum (Mo), aluminum (Al), chromium (Cr), gold (Au), titanium (Ti), nickel (Ni), neodymium (Nd), copper (Cu), or a combination thereof.

The Evss line EVL may include a low reflective conductive material. For example, the Evss line EVL is formed of the low reflective conductive material and thus can prevent visibility from being reduced by the reflection of external light. Thus, a display device according to embodiments of the disclosure does not need to include a separate component for shielding (or absorbing) light incident from outside, like a polarizing film.

The Evss line EVL may function as a black matrix. Therefore, the Evss line EVL can prevent a defect of color mixture from occurring between neighboring pixels. The Evss line EVL may be disposed corresponding to a non-emission region so as to expose at least the emission region. Further, the first embodiment of the disclosure can use the Evss line EVL as the black matrix and thus does not need to additionally perform a separate process for forming the black matrix. Therefore, the first embodiment of the disclosure can further reduce the number of processes compared to a related art structure, and thus can reduce the manufacturing time and the manufacturing cost and remarkably improve product yield.

The color filter CF may include red (R), blue (B), and green (G) color filters. The pixel may include subpixels emitting red, blue, and green light, and the color filters CF may be respectively assigned to the corresponding subpixels. The red, blue, and green color filters CF may be partitioned by the Evss line EVL. If necessary or desired, the pixel may further include a white (W) subpixel.

The conductive filler layer CFL is interposed between the first substrate SUB1 and the second substrate SUB2 and includes a conductive medium. The conductive filler layer CFL may be formed by dispersing conductive fillers in a solvent. Alternatively, the conductive filler layer CFL may include a conductive solvent. For example, the conductive filler layer CFL may include at least one of a conductive polymer, such as poly(3,4-ethylenedioxythiophene) (PEDOT), and an ionic liquid. However, embodiments are not limited thereto.

The distance between the first substrate SUB1 and the second substrate SUB2 may be appropriately selected depending on viscosity of the conductive filler layer CFL. Because the embodiment of the disclosure uses the conductive fillers having lower viscosity than non-conductive fillers, the distance between the first substrate SUB1 and the second substrate SUB2 can be reduced. Hence, the embodiment of the disclosure can secure a wide viewing angle and a high aperture ratio.

The cathode CAT of the first substrate SUB1 and the Evss line EVL of the second substrate SUB2 are electrically connected through the conductive filler layer CFL. Thus, the low potential power voltage is applied to both the cathode CAT and the Evss line EVL.

More specifically, in the embodiment of the disclosure, because the protective layer PAS2 is interposed between the conductive filler layer CFL and the cathode CAT, it is difficult to bring the conductive filler layer CFL into direct contact with the cathode CAT without using the first barrier BR1. Referring to FIG. 4, the embodiment of the disclosure includes the first barrier BR1 and thus can expose at least a portion of the auxiliary electrode AE while physically dividing each of the organic light emitting layer OL, the cathode CAT, and the protective layer PAS2. The exposed portion of the auxiliary electrode AE can directly contact the conductive filler layer CFL to receive the low potential power voltage from the Evss line EVL of the second substrate SUB2, and can also directly contact the cathode CAT to transfer the received low potential power voltage to the cathode CAT.

The first embodiment of the disclosure can reduce a voltage variation (or voltage deviation) depending on a position by connecting the Evss line EVL formed of the low resistance conductive material to the cathode CAT. Hence, the first embodiment of the disclosure can reduce non-uniformity of luminance or a luminance variation (or luminance variation).

The first embodiment of the disclosure does not need to separately assign an area for forming the Evss line EVL and an area for connecting the Evss line EVL and the cathode CAT to the thin film transistor array substrate, as in the related art. Therefore, the first embodiment of the disclosure can be easily applied to a high-resolution display having a high pixel per inch (PPI) and can remarkably improve a degree of design freedom.

Figure 5:
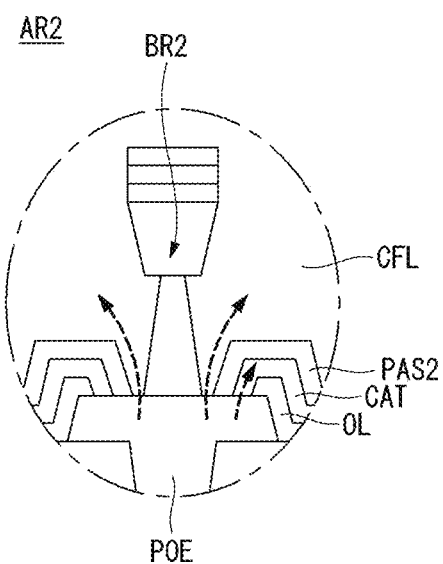
FIG. 5 is an enlarged view of an area AR2 shown in FIG. 3.

With reference to FIG. 5, a supply path of the low potential power voltage generated by a power generator (not shown) is described in detail below. FIG. 5 is an enlarged view of an area AR2 shown in FIG. 3.

Referring to FIGS. 3 and 5, the OLED display according to the first embodiment of the disclosure further includes a connection member LM attached to at least one side of the display panel, particularly, at least one side of the first substrate SUB1. The connection member LM may be a chip-on film (COF). However, embodiments are not limited thereto.

The first substrate SUB1 includes a low potential power voltage pad (hereinafter referred to as "Evss pad") EVP and a power electrode POE. The Evss pad EVP is disposed outside the sealant SL and is electrically connected to the connection member LM. The power electrode POE is disposed inside the sealant SL and is electrically connected to the conductive filler layer CFL.

The Evss pad EVP receives the low potential power voltage generated by the power generator (not shown) through the connection member LM and transfers the received low potential power voltage to the power electrode POE. The power electrode POE then transfers the low potential power voltage to the conductive filler layer CFL.

Namely, the connection member LM, the Evss pad EVP, the power electrode POE, the conductive filler layer CFL, and the cathode CAT may be electrically connected to form a low potential power voltage supply path, and/or the connection member LM, the Evss pad EVP, the power electrode POE, the conductive filler layer CFL, the Evss line EVL, and the cathode CAT may be electrically connected to form a low potential power voltage supply path.

More specifically, the Evss pad EVP includes at least one pad electrode. In the case where the pad electrode is composed of a plurality of layers, the layers may be disposed at different layers with at least one insulating layer interposed therebetween and may be electrically connected through a pad contact hole penetrating the at least one insulating layer. For example, as shown in FIG. 3, the Evss pad EVP may include a first pad electrode PE1 and a second pad electrode PE2 that are disposed at different layers with the passivation layer PAS1 interposed therebetween, and the first pad electrode PE1 and the second pad electrode PE2 may be connected to each other through a first pad contact hole PH1 penetrating the passivation layer PAS1. Hereinafter, the embodiment of the disclosure describes a case where the Evss pad EVP includes the first pad electrode PE1 and the second pad electrode PE2 as an example, for convenience of explanation.

The first pad electrode PE1 is disposed outside the sealant SL and is exposed to the outside. The exposed first pad electrode PE1 may be attached to the connection member LM. The first pad electrode PE1 and the connection member LM may be attached to each other through an anisotropic conductive film (ACF) layer (not shown) interposed between them.

The second pad electrode PE2 is extended to the inside of the sealant SL and is electrically connected to the power electrode POE. In this instance, the second pad electrode PE2 may contact the power electrode POE through a second pad contact hole PH2 penetrating the passivation layer PAS1. FIG. 3 illustrates that the second pad electrode PE2 and the power electrode POE are disposed with only the passivation layer PAS1 interposed therebetween, by way of example. However, embodiments are not limited thereto. For example, the second pad electrode PE2 and the power electrode POE may be disposed at different layers with the passivation layer PAS1 and the planarization layer OC interposed therebetween and may be electrically connected to each other through a contact hole penetrating the passivation layer PAS1 and the planarization layer OC.

The power electrode POE may be formed together when the anode ANO is formed. Namely, the power electrode POE may be formed of the same material as the anode ANO and the auxiliary electrode AE. However, embodiments are not limited thereto.

A second barrier BR2 is positioned on the power electrode POE. The second barrier BR2 may be formed together when the first barrier BR1 is formed. Namely, the second barrier BR2 may be formed of the same material as the first barrier BR1 and may have the same shape as the first barrier BR1.

The second barrier BR2 functions to physically divide each of the organic light emitting layer OL, the cathode CAT, and the protective layer PAS2. In other words, each of the organic light emitting layer OL, the cathode CAT, and the protective layer PAS2 is disposed on the auxiliary electrode AE and is physically divided by the second barrier BR2. Hence, each of the organic light emitting layer OL, the cathode CAT, and the protective layer PAS2 may be discontinuously formed on the auxiliary electrode AE.

In the embodiment of the disclosure, the organic light emitting layer OL, the cathode CAT, and the protective layer PAS2 are disposed inside the sealant SL and on the entire surface of the first substrate SUB1. Therefore, when the second barrier BR2 is not included, the organic light emitting layer OL, the cathode CAT, and the protective layer PAS2 are formed to completely cover the power electrode POE positioned inside the sealant SL. In this instance, the power electrode POE and the cathode CAT cannot be electrically connected to each other because of the organic light emitting layer OL, and the power electrode POE and the conductive filler layer CFL cannot be electrically connected to each other because of the organic light emitting layer OL and the protective layer PAS2.

The first embodiment of the disclosure forms the second barrier BR2 on the power electrode POE and thus can expose at least a portion of the power electrode POE while physically dividing each of the organic light emitting layer OL, the cathode CAT, and the protective layer PAS2 on the power electrode POE. A portion of the organic light emitting layer OL, a portion of the cathode CAT, and a portion of the protective layer PAS2, each of which is divided by the second barrier BR2, are sequentially stacked on the second barrier BR2.

An exposed portion of the power electrode POE directly contacts the conductive filler layer CFL and supplies the low potential power voltage to the conductive filler layer CFL. Hence, a power supply path connecting the connection member LM, the Evss pad EVP, and the conductive filler layer CFL may be formed.

The cathode CAT on the power electrode POE may cover the organic light emitting layer OL, and one end of the cathode CAT may directly contact the power electrode POE. Namely, one end of the cathode CAT, which is divided by the second barrier BR2 and is exposed, may directly contact an exposed upper surface the power electrode POE. Hence, a power supply path connecting the connection member LM, the Evss pad EVP, and the cathode CAT may be formed.

Figure 6:
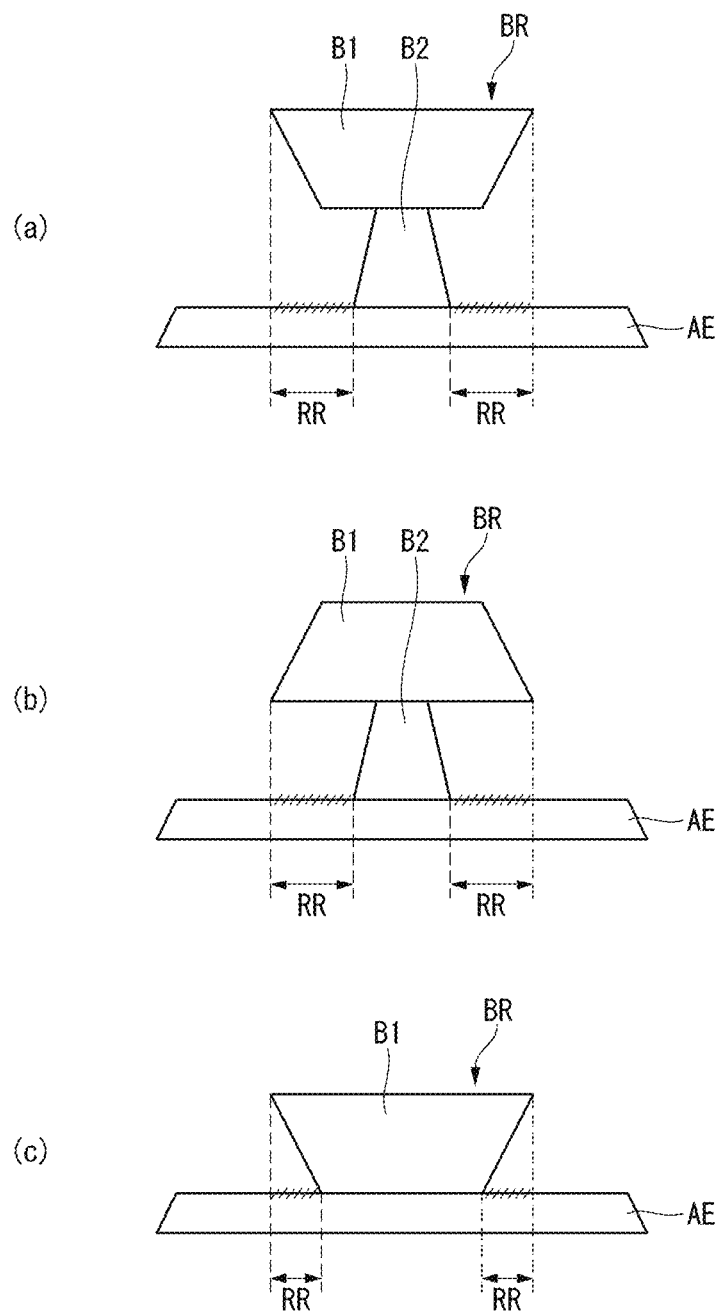
FIG. 6 is cross-sectional views schematically illustrating a shape of a barrier including first and second barriers.

With reference to FIG. 6, an example of a shape of a barrier according to an embodiment of the disclosure is described below. FIG. 6 is cross-sectional views schematically illustrating a shape of a barrier including first and second barriers.

A barrier BR may be formed as a double layer including a first structure B1 and a second structural B2. The first structure B1 may be disposed on the second structural B2, and an edge of the first structure B1 may have an eaves shape. Namely, the edge of the first structure B1 may protrude from an edge of the second structural B2 to the outside by a predetermined distance RR. The distance RR between the edge of the first structure B1 and the edge of the second structural B2 may be properly selected so that the barrier BR can expose at least a portion of an auxiliary electrode AE while dividing each of an organic light emitting layer, a cathode, and a protective layer. In other words, each of the organic light emitting layer OL (see FIG. 3), the cathode CAT (see FIG. 3), and the protective layer PAS2 (see FIG. 3) is patterned to expose at least a portion of the auxiliary electrode AE while being divided around the barrier BR due to the predetermined distance RR between the edge of the first structure B1 and the edge of the second structural B2. The first structure B1 may have a reverse taper shape as shown in portion (a) of FIG. 6 and may have a taper shape as shown in portion (b) of FIG. 6. The first structure B1 and the second structural B2 may be formed of different materials.

A barrier BR may be formed as a single layer including a first structure B1. In this instance, the first structure B1 has a shape in which an edge of an upper side protrudes from an edge of a lower side to the outside by a predetermined distance RR. For example, the first structure B1 may have a reverse taper shape as shown in portion (c) of FIG. 6. Namely, a vertical cross-sectional shape of the first structure B1 may have a trapezoidal shape, the upper side may have a length longer than the lower side, and one end of the upper side may protrude from one end of the lower side to the outside by the predetermined distance RR. The distance RR between one end of the upper side and one end of the lower side may be properly selected so that the barrier BR can expose at least a portion of an auxiliary electrode AE while dividing each of an organic light emitting layer, a cathode, and a protective layer. In other words, each of the organic light emitting layer OL (see FIG. 3), the cathode CAT (see FIG. 3), and the protective layer PAS2 (see FIG. 3) is patterned to expose at least a portion of the auxiliary electrode AE while being divided around the barrier BR due to the distance RR between one end of the upper side and one end of the lower side.

Second Embodiment

Figure 7:
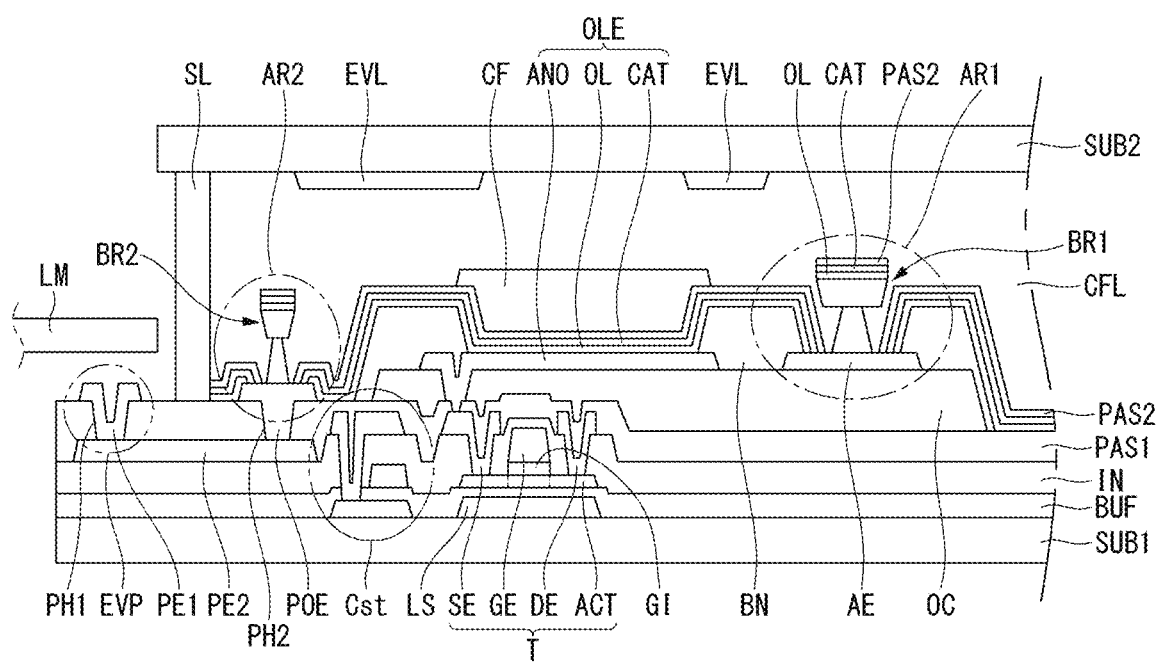
FIG. 7 is a cross-sectional view of an OLED display according to a second embodiment of the disclosure.

FIG. 7 is a cross-sectional view of an OLED display according to a second embodiment of the disclosure. Description of structures and components identical or equivalent to those illustrated in the first embodiment is omitted in the second embodiment.

Referring to FIG. 7, an OLED display according to a second embodiment of the disclosure includes a first substrate SUB1 and a second substrate SUB2 facing each other and a conductive filler layer CFL between the first substrate SUB1 and the second substrate SUB2. The first substrate SUB1 is a thin film transistor array substrate on which a thin film transistor T and an organic light emitting diode OLE connected to the thin film transistor T are formed. The second substrate SUB2 is a substrate on which an Evss line EVL is formed.

Unlike the first embodiment, a color filter CF according to the second embodiment of the disclosure is formed on the first substrate SUB1. Namely, the thin film transistor T and the organic light emitting diode OLE connected to the thin film transistor T are formed on the first substrate SUB1, and the color filter CF is formed on the organic light emitting diode OLE. The second embodiment of the disclosure can further reduce a distance between the color filter CF and an organic light emitting layer OL compared to the first embodiment, and thus can increase a viewing angle and sufficiently secure an aperture ratio.

The color filter CF may be interposed between a cathode CAT constituting the organic light emitting diode OLE and a protective layer PAS2, or may be disposed on the protective layer PAS2. For example, the color filter CF may be disposed on the protective layer PAS2. In this case, it is possible to minimize or reduce the deterioration of the organic light emitting diode OLE that may occur due to exposure to the process environment for forming the color filter CF.

Third Embodiment

Figure 8:
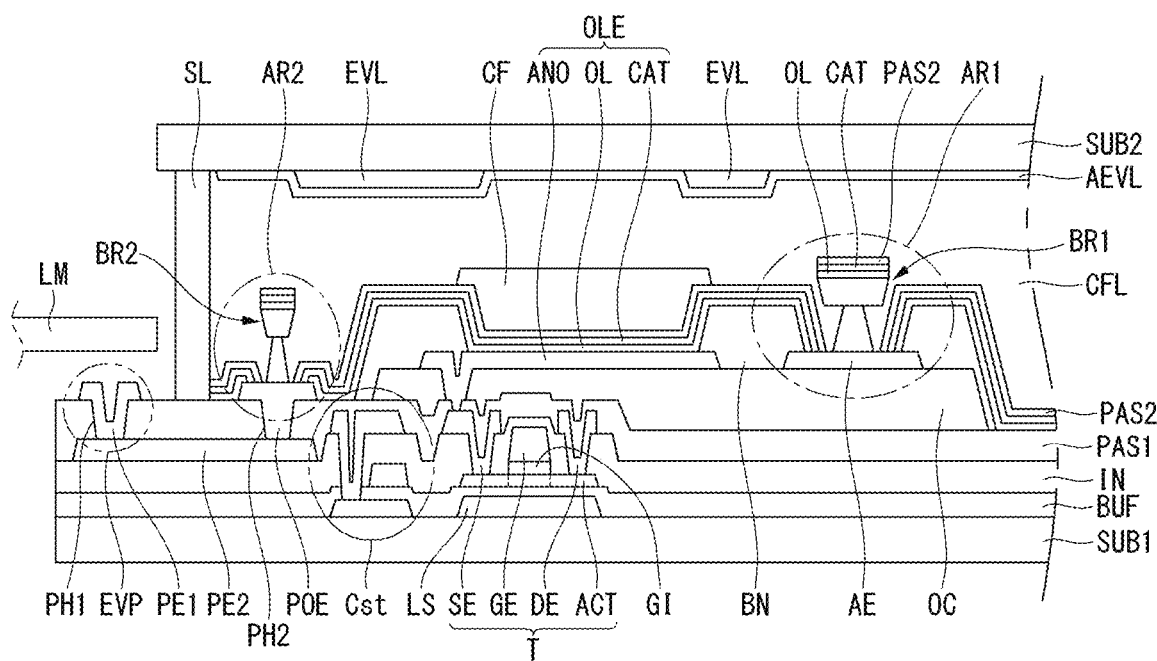
FIG. 8 is a cross-sectional view of an OLED display according to a third embodiment of the disclosure.

FIG. 8 is a cross-sectional view of an OLED display according to a third embodiment of the disclosure. Description of structures and components identical or equivalent to those illustrated in the first and second embodiments is omitted in the third embodiment.

Referring to FIG. 8, an OLED display according to a third embodiment of the disclosure includes a first substrate SUB1 and a second substrate SUB2 facing each other and a conductive filler layer CFL between the first substrate SUB1 and the second substrate SUB2. The first substrate SUB1 is a thin film transistor array substrate on which a thin film transistor T and an organic light emitting diode OLE connected to the thin film transistor T are formed. The second substrate SUB2 is a substrate on which an Evss line EVL is formed.

The Evss line EVL and an auxiliary Evss line (or referred to as "auxiliary power line") AEVL are formed on the second substrate SUB2. A color filter CF may be positioned on the second substrate SUB2 as in the first embodiment and may be positioned on the first substrate SUB1 as in the second embodiment.

One surface of the auxiliary Evss line AEVL directly contacts the Evss line EVL, and the other surface of the auxiliary Evss line AEVL directly contacts the conductive filler layer CFL. The auxiliary Evss line AEVL is a power line for increasing a contact area between the Evss line EVL and the conductive filler layer CFL and may have an area larger than the Evss line EVL. The auxiliary Evss line AEVL may be interposed between the Evss line EVL and the conductive filler layer CFL. The auxiliary Evss line AEVL may be formed to cover the Evss line EVL and the color filter CF and may be widely formed on a front surface of the second substrate SUB2 including an emission region. The auxiliary Evss line AEVL may be formed of a transparent conductive material such as indium tin oxide (ITO) and indium zinc oxide (IZO).

Because the third embodiment of the disclosure can sufficiently secure the contact area between the Evss line EVL and the conductive filler layer CFL using the auxiliary Evss line AEVL, the third embodiment of the disclosure can minimize or reduce a contact failure between the Evss line EVL and the conductive filler layer CFL. Further, the third embodiment of the disclosure can more efficiently reduce a voltage variation depending on a position and thus can reduce non-uniformity of luminance or a luminance variation.

Fourth Embodiment

Figure 9:
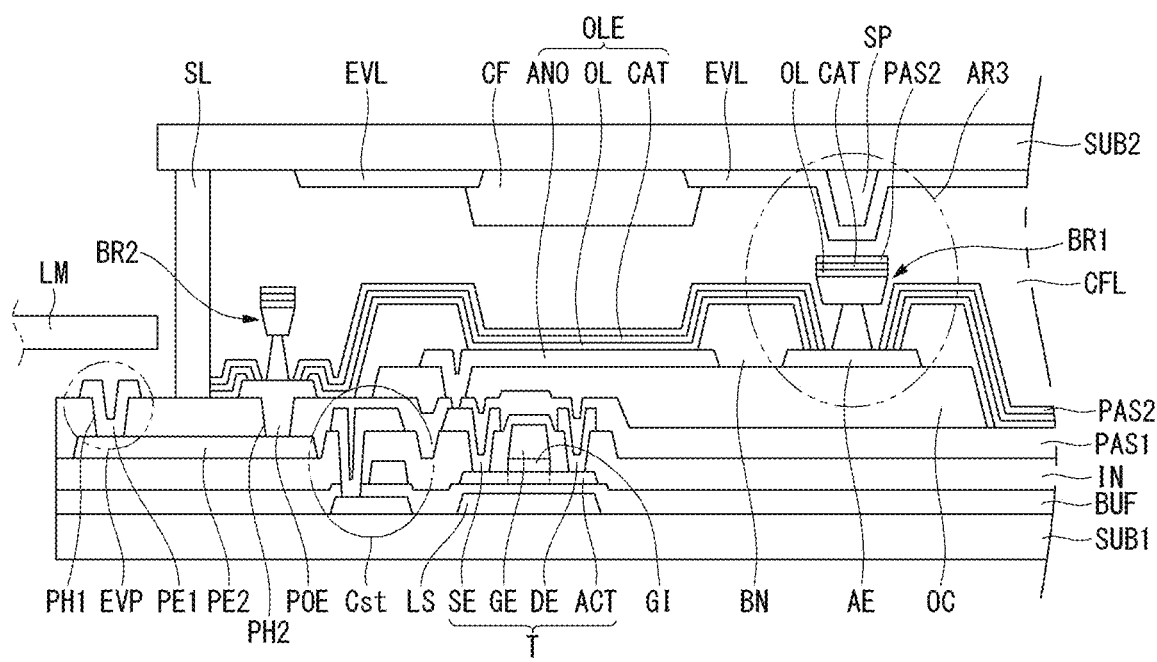
FIG. 9 is a cross-sectional view of an OLED display according to a fourth embodiment of the disclosure.
Figure 10:
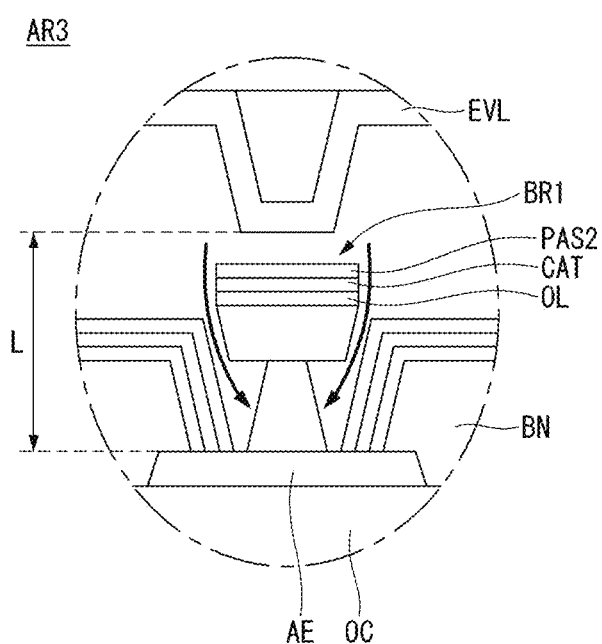
FIGS. 10 and 11 enlargedly illustrate an area AR3 shown in FIG. 9.
Figure 11:
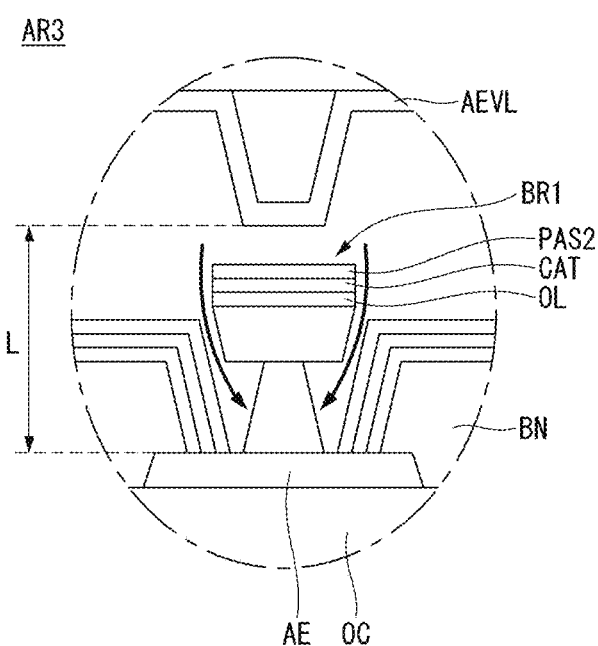
Figure 12:
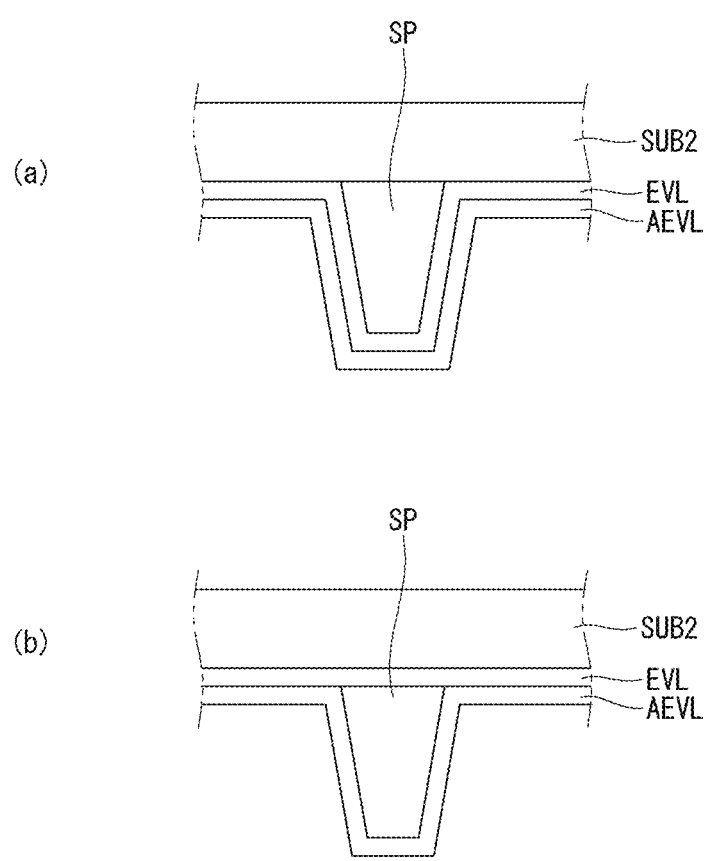
FIG. 12 illustrates a position relationship of a spacer, an Evss line, and an auxiliary Evss line.

FIG. 9 is a cross-sectional view of an OLED display according to a fourth embodiment of the disclosure. FIGS. 10 and 11 enlargedly illustrate an area AR3 shown in FIG. 9. FIG. 12 illustrates a position relationship of a spacer, an Evss line, and an auxiliary Evss line. Description of structures and components identical or equivalent to those illustrated in the first to third embodiments is omitted in the fourth embodiment.

In the fourth embodiment of the disclosure, as described above, a cathode CAT of a first substrate SUB1 and an Evss line EVL of a second substrate SUB2 are electrically connected to each other through a conductive filler layer CFL.

Thus, the Evss line EVL can transfer a low potential power voltage to the cathode CAT through the conductive filler layer CFL. In this instance, the cathode CAT does not directly contact the conductive filler layer CFL and receives the low potential power voltage from the conductive filler layer CFL through an auxiliary electrode AE.

The auxiliary electrode AE of the first substrate SUB1 and the Evss line EVL of the second substrate SUB2 are spaced from each other by an attachment distance between the first substrate SUB1 and the second substrate SUB2 and are also electrically connected to each other through the conductive filler layer CFL between the first substrate SUB1 and the second substrate SUB2. Therefore, it may be difficult to perform the supply of power voltage due to a resistance of the conductive filler layer CFL. More specifically, because an influence of the resistance increases corresponding to a distance between the auxiliary electrode AE and the Evss line EVL, it may be difficult to perform the supply of the power voltage from the Evss line EVL to the auxiliary electrode AE. Thus, a method for reducing the distance between the first substrate SUB1 and the second substrate SUB2 in consideration of the resistance may be considered. However, because the attachment distance between the first substrate SUB1 and the second substrate SUB2 is previously determined and fixed in consideration of characteristics of display devices, there is a limit to controlling the attachment distance. Hence, the fourth embodiment of the disclosure proposes a method capable of reducing the problem of the supply of the power voltage.

Referring to FIGS. 9 and 10, the fourth embodiment of the disclosure forms a spacer SP on the second substrate SUB2, in order to reduce a distance between the auxiliary electrode AE and the Evss line EVL. The spacer SP has a shape protruding toward the first substrate SUB1. The spacer SP may be formed of an organic material such as polyimide, benzocyclobutene-based resin, and acrylate. However, embodiments are not limited thereto. The spacer SP is disposed adjacent to the auxiliary electrode AE. To this end, the spacer SP may be disposed to overlap the auxiliary electrode AE in an up-down direction.

The Evss line EVL is extended to cover the spacer SP. FIG. 9 illustrates that the Evss line EVL completely covers the spacer SP, by way of example. However, embodiments are not limited thereto. For example, the Evss line EVL may be extended to cover at least a portion of the spacer SP, so that the Evss line EVL is disposed adjacent to the auxiliary electrode AE of the first substrate SUB1. Further, the Evss line EVL may be extended up to a most protruding portion (e.g., an upper surface) of the spacer SP, so that the Evss line EVL is positioned as close as possible to the auxiliary electrode AE.

The fourth embodiment of the disclosure may further include an auxiliary Evss line AEVL as in the third embodiment. In this instance, as shown in FIG. 11, the auxiliary Evss line AEVL may be extended to cover the spacer SP. FIG. 11 illustrates that the auxiliary Evss line AEVL completely covers the spacer SP, by way of example. However, embodiments are not limited thereto. For example, the auxiliary Evss line AEVL may be extended to cover at least a portion of the spacer SP, so that the auxiliary Evss line AEVL is disposed adjacent to the auxiliary electrode AE of the first substrate SUB1. Further, the auxiliary Evss line AEVL may be extended up to a most protruding portion (e.g., an upper surface) of the spacer SP, so that the auxiliary Evss line AEVL is positioned as close as possible to the auxiliary electrode AE.

As shown in portion (a) FIG. 12, both the Evss line EVL and the auxiliary Evss line AEVL may be sequentially disposed on the spacer SP. Alternatively, as shown in portion (b) of FIG. 12, the spacer SP may be interposed between the Evss line EVL and the auxiliary Evss line AEVL. More specifically, the spacer SP may be disposed on the Evss line EVL, and the auxiliary Evss line AEVL may be disposed to cover at least a portion of the spacer SP.

The fourth embodiment of the disclosure includes the spacer SP and thus can set a distance between the Evss line EVL and the auxiliary electrode AE and/or a distance between the auxiliary Evss line AEVL and the auxiliary electrode AE to a minimum or a reduced value possible in the process. Hence, the fourth embodiment of the disclosure can reduce the above-described influence of resistance and stably supply the power voltage to the cathode CAT.

The spacer SP may be positioned opposite a first barrier BR1. More specifically, when an external force is provided for the OLED display, the OLED display may be pressurized by the external force and may reduce the attachment distance between the first substrate SUB1 and the second substrate SUB2 at a specific position. In this instance, a protective layer PAS2 may be damaged by the spacer SP protruding toward the second substrate SUB2 and may cause a defect such as the penetration of foreign material into an organic light emitting diode OLE. In order to prevent this, the spacer SP may overlap the first barrier BR1 and may be disposed opposite the first barrier BR1. In this instance, because the spacer SP contacts the first barrier BR1 or moves on the first barrier BR1 by the provided external force, a direct contact between the spacer SP and the protective layer PAS2 can be prevented. Hence, product reliability can be secured.

It will be apparent to those skilled in the art that various modifications and variations can be made in the organic light emitting diode display of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display, comprising:
   a first substrate;
   a second substrate; and
   a conductive filler layer interposed between the first substrate and the second substrate, the conductive filler layer including a conductive medium,
   wherein the first substrate includes:
   an auxiliary electrode;
   a first barrier disposed on the auxiliary electrode;
   a cathode included in an organic light emitting diode and physically divided by the first barrier, the cathode exposing at least a portion of the auxiliary electrode, one end of the cathode directly contacting the auxiliary electrode; and
   a protective layer disposed on the cathode and physically divided by the first barrier, the protective layer exposing at least a portion of the auxiliary electrode, one end of the protective layer directly contacting the auxiliary electrode,
   wherein the second substrate includes:
   a spacer protruding toward the first substrate and disposed adjacent to the auxiliary electrode; and
   a power line covering at least a portion of the spacer and supplied with a power voltage.

2. The organic light emitting diode display of claim 1, wherein the spacer overlaps the auxiliary electrode.

3. The organic light emitting diode display of claim 1, wherein the spacer overlaps the first barrier.

4. The organic light emitting diode display of claim 1, wherein the power line includes:
   an Evss line; and
   an auxiliary Evss line covering at least a portion of the Evss line, electrically connected to the Evss line and having an area larger than the Evss line.

5. The organic light emitting diode display of claim 4, wherein only one of the Evss line and the auxiliary Evss line covers at least a portion of the spacer.

6. The organic light emitting diode display of claim 4, wherein the spacer is disposed on the Evss line,
   wherein the auxiliary Evss line covers at least a portion of the spacer.

7. The organic light emitting diode display of claim 4, wherein each of the first substrate and the second substrate includes an emission region and a non-emission region outside the emission region,
   wherein the Evss line is disposed in the non-emission region,
   wherein the auxiliary Evss line covers the Evss line and is extended up to at least a portion of the emission region.

8. The organic light emitting diode display of claim 4, wherein the auxiliary Evss line is formed of a transparent conductive material.

9. The organic light emitting diode display of claim 8, wherein the cathode directly contacts the power electrode.

10. The organic light emitting diode display of claim 1, further comprising:
    a power electrode disposed on the first substrate and receiving the power voltage from a power generator; and
    a second barrier disposed on the power electrode,
    wherein the cathode is divided by the second barrier and exposes at least a portion of the power electrode,
    wherein the protective layer is divided by the second barrier and exposes at least a portion of the power electrode.

* * * * *